United States Patent
Cha et al.

(10) Patent No.: US 9,780,771 B2
(45) Date of Patent: Oct. 3, 2017

(54) GATE DRIVING CIRCUIT INCLUDING CONSTANT CURRENT SOURCES, AND SWITCHING APPARATUS AND POWER SUPPLY APPARATUS HAVING THE SAME

(71) Applicants: SAMSUNG ELECTRO-MECHANICS CO., LTD., Suwon-Si, Gyeonggi-Do (KR); University of Seoul Industry Cooperation Foundation, Seoul (KR)

(72) Inventors: Sang Hyun Cha, Suwon-Si (KR); Deuk Hee Park, Suwon-Si (KR); Yun Joong Lee, Suwon-Si (KR); Joong Ho Choi, Seongnam-Si (KR); Je Hyeon Yu, Suwon-Si (KR); Hyeon Seon Yu, Seongnam-Si (KR); Chang Seok Lee, Suwon-Si (KR)

(73) Assignee: UNIVERSITY OF SEOUL INDUSTRY COOPERATION FOUNDATION, Seoul (KR)

(*) Notice: Subject to any disclaimer, the term of this patent is extended or adjusted under 35 U.S.C. 154(b) by 572 days.

(21) Appl. No.: 14/288,070

(22) Filed: May 27, 2014

(65) Prior Publication Data

US 2015/0117065 A1    Apr. 30, 2015

(30) Foreign Application Priority Data

Oct. 31, 2013  (KR) .......................... 10-2013-0131617

(51) Int. Cl.
*H02M 3/335* (2006.01)
*H03K 17/06* (2006.01)
*H03K 17/687* (2006.01)

(52) U.S. Cl.
CPC ...... *H03K 17/063* (2013.01); *H02M 3/33507* (2013.01); *H03K 17/687* (2013.01)

(58) Field of Classification Search
CPC .......................... H02M 3/335; H02M 3/33507
(Continued)

(56) References Cited

U.S. PATENT DOCUMENTS 5,914,590 A  *  6/1999  Wacknov ............ H02M 3/1563
                                                              323/282
6,538,507 B2 *  3/2003  Prentice ................ H03F 1/3211
                                                              330/134

(Continued)

FOREIGN PATENT DOCUMENTS

| JP | 2007-282444 A | 10/2007 |
| JP | 2008-092272 A | 4/2008 |
| KR | 10-0743519 B1 | 7/2007 |

*Primary Examiner* — Adolf Berhane
*Assistant Examiner* — Nusrat Quddus
(74) *Attorney, Agent, or Firm* — McDermott Will & Emery LLP

(57) ABSTRACT

A gate driving circuit may include: a bias unit receiving an input signal having preset high and low signal levels, including a first N-MOSFET turned on in the case in which the input signal has the high level and a first P-MOSFET turned on in the case in which the input signal has the low level, and supplying bias powers by the turning-on of the first N-MOSFET and the first P-MOSFET; and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing a gate signal depending on the turning-on of the second N-MOSFET and the second P-MOSFET.

14 Claims, 4 Drawing Sheets

(58) Field of Classification Search
USPC ......... 363/21.01, 21.04, 21.05, 21.06, 21.07, 363/21.09, 21.1, 21.11, 123–127
See application file for complete search history.

(56) References Cited

U.S. PATENT DOCUMENTS

| | | | |
|---|---|---|---|
| 8,044,690 B2 * | 10/2011 | Patel | ........................ H03F 3/217 327/131 |
| 2003/0094980 A1 * | 5/2003 | Ajit | .......................... G11C 5/14 327/112 |
| 2006/0022740 A1 * | 2/2006 | Kim | .................... H03D 7/1441 327/359 |
| 2014/0320208 A1 * | 10/2014 | Sheng | ................... H03F 1/0272 330/261 |

* cited by examiner

GATE DRIVING CIRCUIT INCLUDING CONSTANT CURRENT SOURCES, AND SWITCHING APPARATUS AND POWER SUPPLY APPARATUS HAVING THE SAME

CROSS-REFERENCE TO RELATED APPLICATION

This application claims the benefit of Korean Patent Application No. 10-2013-0131617 filed on Oct. 31, 2013, with the Korean Intellectual Property Office, the disclosure of which is incorporated herein by reference.

BACKGROUND

The present disclosure relates to a gate driving circuit for driving a switch, and a switching apparatus and a power supply apparatus having the same.

Generally, electronic apparatuses performing various functions depending on user selection include a semiconductor switch in order to perform a function change, a switching operation, or the like, and mainly use a gate driving circuit in order to drive the semiconductor switch.

Among such electronic apparatuses, a power supply apparatus mainly uses a switching mode power supply (SMPS) scheme in switching power and uses a power switch in order to switch the power. Therefore, agate driving circuit for driving the power switch may be necessarily used in the power supply apparatus.

Meanwhile, the gate driving circuit described above provides a high level signal and a low level signal for turning the switch on or off. To this end, as disclosed in the following Related Art Document (Patent Document 1), at least two switches may be connected to each other in series to output a gate signal.

However, in the gate driving circuit according to the related art described above, in order to stably provide the high level signal and the low level signal for turning the switch on or off, dead time controlling is performed so that the at least two switches are alternately switched on and off and an output buffer is used, causing power consumption.

RELATED ART DOCUMENT (Patent Document 1) Japanese Patent Laid-Open Publication No. 2007-282444

SUMMARY

An aspect of the present disclosure may provide a gate driving circuit having a class B amplifier structure that does not require dead time controlling, and a switching apparatus and a power supply apparatus having the same.

Further, the present disclosure has been derived from a study performed as a part of IT Research Center growth and support of the National IT Industry Promotion Agency managed by the Ministry of Science, ICT and Future Planning of Korea and Industry Academic Cooperation Foundation of The University of Seoul.

"Subject Serial No: NIPA-2013-(H0301-13-1013)
Ministry Name: Ministry of Science, ICT and Future Planning
Project Name: IT Research Center Growth and Support of National IT Industry Promotion Agency
Project Subject Name: Development and Manpower Training of Core Design Technology of System Semiconductor for Information Device
Managing Department: Industry Academic Cooperation Foundation of The University of Seoul
Study Period: 2013.01.01~2013.12.31"

According to an aspect of the present disclosure, a gate driving circuit may include: a bias unit receiving an input signal having preset high and low signal levels, including a first N-channel metal oxide semiconductor field effect transistor (N-MOSFET) turned on in the case in which the input signal has a high level and a first P-channel MOS FET (P-MOSFET) turned on in the case in which the input signal has a low level, and supplying bias powers by the turning-on of the first N-MOSFET and the first P-MOSFET; and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing a gate signal depending on the turning-on of the second N-MOSFET and the second P-MOSFET.

The gate driving circuit may further include a constant current source unit including a plurality of constant current sources providing preset constant currents.

The first N-MOSFET and the first P-MOSFET may be connected to each other in series between the plurality of constant current sources, a source of the first N-MOSFET and a source of the first P-MOSFET may receive the input signal through resistors, respectively, and a gate of the first N-MOSFET and a gate of the first P-MOSFET may supply the bias powers, respectively.

The second N-MOSFET and the second P-MOSFET may be connected to each other in series between a driving power terminal and a ground, agate of the second N-MOSFET may receive the bias power supplied from the first N-MOSFET, a gate of the second P-MOSFET may receive the bias power supplied from the first P-MOSFET, and a source of the second N-MOSFET and a source of the second P-MOSFET may be commonly connected to each other to output the gate signal.

The gate driving circuit may further include a level shifter shifting the signal level of the input signal and transferring the input signal having the shifted signal level to the sources of the first N-MOSFET and the first P-MOSFET of the bias unit through the resistors, respectively.

The gate driving circuit may further include an enabling switch connected to a gate signal output terminal of the amplifying unit and controlling whether or not the gate signal is output depending on an external control signal.

According to another aspect of the present disclosure, a switching apparatus may include: a gate driving circuit including a bias unit receiving an input signal having preset high and low signal levels, including a first N-MOSFET turned on in the case in which the input signal has the high level and a first P-MOSFET turned on in the case in which the input signal has the low level, and supplying bias powers by the turning-on of the first N-MOSFET and the first P-MOSFET, and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing a gate signal depending on the turning-on of the second N-MOSFET and the second P-MOSFET; and a switch switched on and off depending on the gate signal from the gate driving circuit to open and close a preset signal transfer path.

According to another aspect of the present disclosure, a power supply apparatus may include: a power supplying unit switching an input power depending on a provided gate signal to supply a preset direct current (DC) power; and a controlling unit including a gate driving circuit including a bias unit receiving an input signal having preset high and low signal levels, including a first N-MOSFET turned on in the case in which the input signal has the high level and a first P-MOSFET turned on in the case in which the input signal has the low level, and supplying bias powers by the turning-on of the first N-MOSFET and the first P-MOSFET, and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing the gate signal controlling the switching of the power supplying unit depending on the turning-on of the second N-MOSFET and the second P-MOSFET.

The power supplying unit may include: a transformer having a primary winding receiving the input power, a secondary winding forming a preset turns ratio together with the primary winding and receiving a power induced from the primary winding, and an auxiliary winding forming a preset turns ratio together with the primary winding, receiving a power induced from the primary winding, and supplying a driving power to the controlling unit; and a switch switching on and off the input power from the primary winding depending on the gate signal from the controlling unit.

The controlling unit may further include a gate controlling unit providing the input signal to the gate driving circuit based on a voltage level of the input power, a detection voltage at which a current flowing in the switch is detected, and a voltage level of the driving power from the auxiliary winding.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
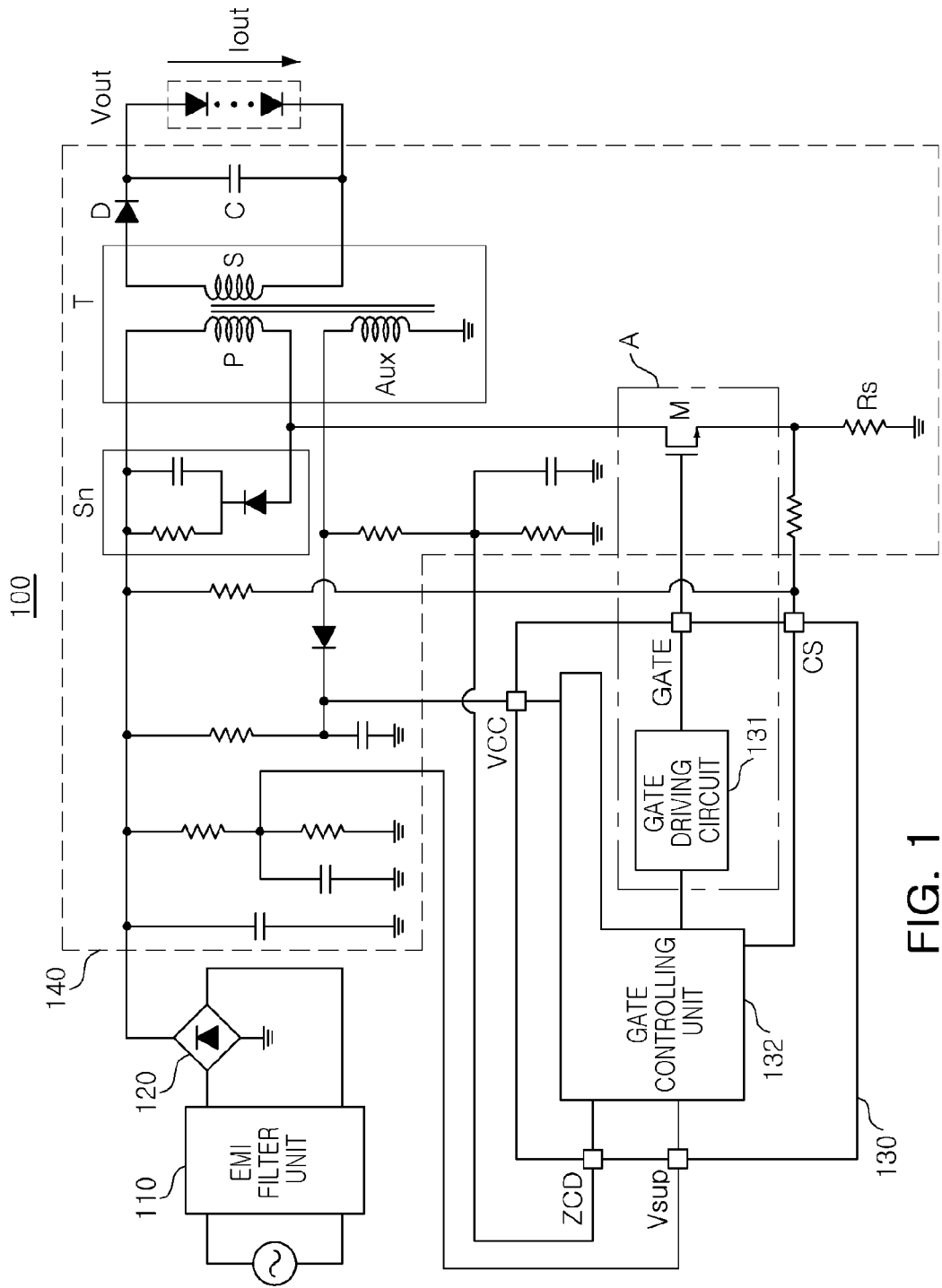
FIG. 1 is a schematic circuit diagram of a power supply apparatus according to an exemplary embodiment of the present disclosure.

Exemplary embodiments of the present disclosure will now be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Throughout the drawings, the same reference numerals will be used throughout to designate the same or like elements.

FIG. 1 is a schematic circuit diagram of a power supply apparatus according to an exemplary embodiment of the present disclosure.

Referring to FIG. 1, a power supply apparatus 100 according to an exemplary embodiment of the present disclosure may include an electromagnetic interference (EMI) filter unit 110, a rectifying unit 120, a controlling unit 130, and a power supplying unit 140.

The EMI filter unit 110 may filter electromagnetic interference (EMI) of an input alternating current (AC) power and transfer the filtered AC power to the rectifying unit 120.

The rectifying unit 120 may rectify the filtered AC power and transfer the rectified power to the power supplying unit 140.

The power supplying unit 140 may include a switch M switching the rectified power and a transformer T inducing and outputting the switched power.

The switch M may switch the rectified power depending on a control of the controlling unit 130. In more detail, the switch M may switch the rectified power input to a primary winding P of the transformer T. To this end, the switch M may be connected between one end of the primary winding P and a ground, and the rectified power Vsup may be input to the other end of the primary winding P.

The transformer T may include the primary winding P, a secondary winding S, and an auxiliary winding Aux.

The transformer T may have a primary side and a secondary side at which electrical properties of a ground are different from each other, and the primary winding P and the auxiliary winding Aux may be formed at the primary side and the secondary winding S may be formed at the secondary side. In addition, the controlling unit 130 may be formed at the primary side.

Each of the primary winding P, the secondary winding S, and the auxiliary winding Aux may have a preset turn, the primary winding P and the secondary winding S may be magnetically coupled to each other to form a preset turns ratio therebetween, and the rectified power Vsup input to the primary winding P may be induced to the secondary winding S depending on the turn ratio through the switching of the switch M (lo).

The power induced to the secondary winding S may be stabilized by a diode D and a capacitor C of an output terminal and be then supplied to at least one light emitting diode. A plurality of light emitting diodes may be connected to each other in series. In addition, although not shown, a plurality of light emitting diode arrays may also be connected in parallel with each other.

The auxiliary winding Aux may form preset turns ratios together with the primary winding P and the secondary winding S, respectively, to receive the power induced from the primary winding P to the secondary winding S, thereby detecting state information of the power induced to the secondary winding S depending on the turn ratio and providing a driving power VCC capable of operating the controlling unit 130.

The state information ZCD of the power detected by the auxiliary winding Aux may include zero voltage information of the power induced from the primary winding P to the secondary winding S and may also be transferred to the controlling unit 130.

In addition, the power supplying unit 140 may further include a snubber circuit Sn suppressing a power spike component at the time of a power transformation switching operation and a detection resistor Rs for detecting a current flowing in the switch M at the time of switching on the switch M.

The controlling unit 130 may include a gate driving circuit 131 and a gate controlling unit 132.

Figure 2:
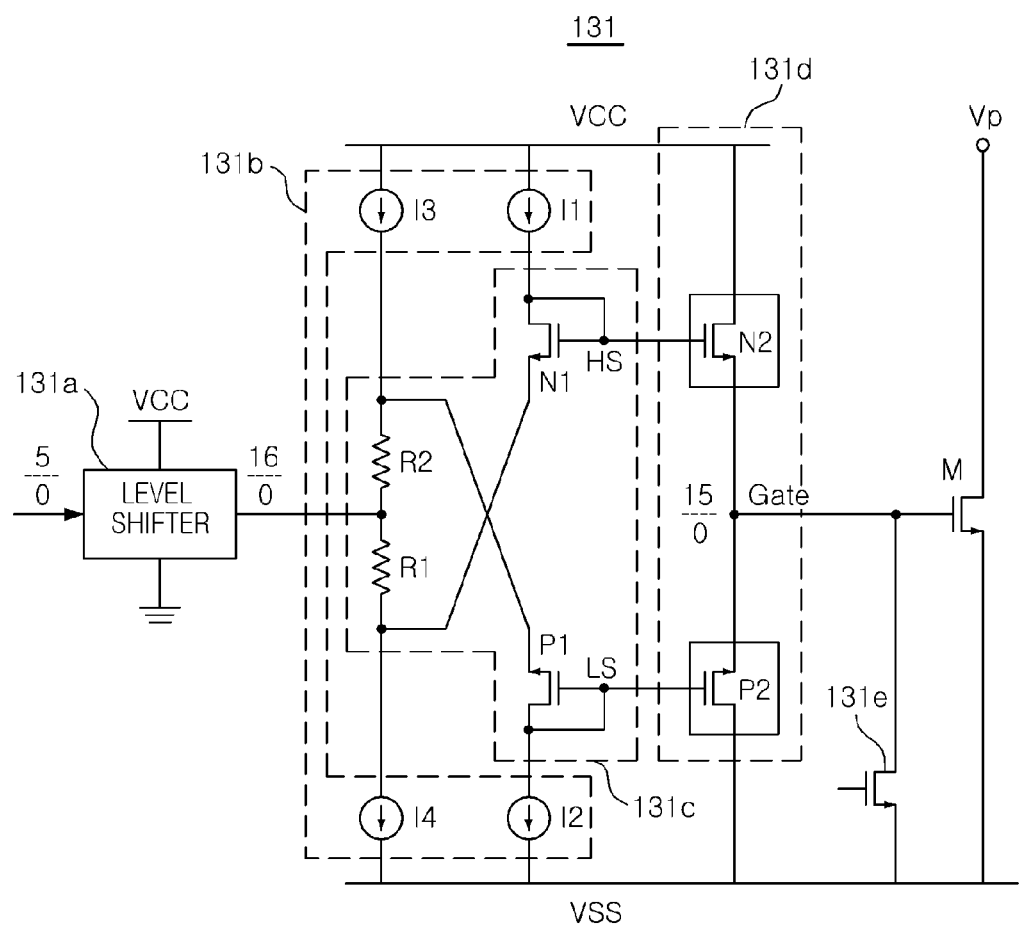
FIG. 2 is a schematic circuit diagram of a gate driving circuit used in the power supply apparatus according to an exemplary embodiment of the present disclosure shown in FIG. 1.

FIG. 2 is a schematic circuit diagram of a gate driving circuit used in the power supply apparatus according to an exemplary embodiment of the present disclosure shown in FIG. 1.

Referring to FIGS. 1 and 2, the gate driving circuit 131 may include a level shifter 131*a*, a constant current source unit 131*b*, a bias unit 131*c*, an amplifying unit 131*d*, and an enabling switch 131*e*.

The level shifter 131*a* may receive a driving power VCC and shift a voltage level of an input signal. For example, the level shifter 131*a* may shift a voltage level of an input signal having a low level of 0V and a high level of 5V so as to become a signal having a low level of 0V and a high level of 16V.

The constant current source unit 131*b* may include a plurality of constant current sources I1, I2, I3, and I4, and the bias unit 131*c* may be electrically connected to the constant current source unit 131*b* to supply a bias power to the amplifying unit 131*d*.

The bias unit 131*c* may include a first N-channel metal oxide semiconductor field effect transistor (N-MOSFET) N1 and a first P-channel MOSFET (P-MOSFET) P1, and the first N-MOSFET N1 and the first P-MOSFET P1 may be connected to each other in series between the plurality of constant current sources. In more detail, first and second constant current sources I1 and I2 may be disposed between a driving power terminal supplying the driving power VCC and a ground VSS, and a drain of the first N-MOSFET N1 may be connected to the first constant current source I1 and a source of the first N-MOSFET N1 may be connected to a first resistor R1 and a fourth constant current source I4. A drain of the first P-MOSFET P1 may be connected to the second constant current source I2 and a source of the first P-MOSFET P1 may be connected to a second resistor R2 and a third constant current source I3. The input signal of which the voltage level is shifted by the level shifter 131*a* may be transferred to a connection point between the first and second resistors R1 and R2, and the respective gates of the first N-MOSFET N1 and the first P-MOSFET P1 of the bias unit 131*c* may supply bias powers to the amplifying unit 131*d*, respectively.

The amplifying unit 131*d* may include a second N-MOSFET N2 and a second P-MOSFET P2 connected to each other in series between the driving power terminal and the ground VSS.

A drain of the second N-MOSFET N2 may be connected to the driving power terminal, a gate thereof may receive the bias power supplied from the first N-MOSFET N1, and a source thereof may be connected to a source of the second P-MOSFET P2. A drain of the second P-MOSFET P2 may be connected to the ground VSS, and a gate thereof may receive the bias power supplied from the first P-MOSFET P1.

The sources of the second N-MOSFET N2 and the second P-MOSFET P2 may be commonly connected to each other to provide a gate signal GATE driving the switch M.

In addition, the gate driving circuit 131 may include the enabling switch 131*e* connected to a signal output terminal through which the gate signal GATE is output from the commonly connected sources of the second N-MOSFET N2 and the second P-MOSFET P2, wherein the enabling switch 131*e* may be switched on/off depending on an external control signal to intermit an output of the gate signal GATE.

Figure 3:
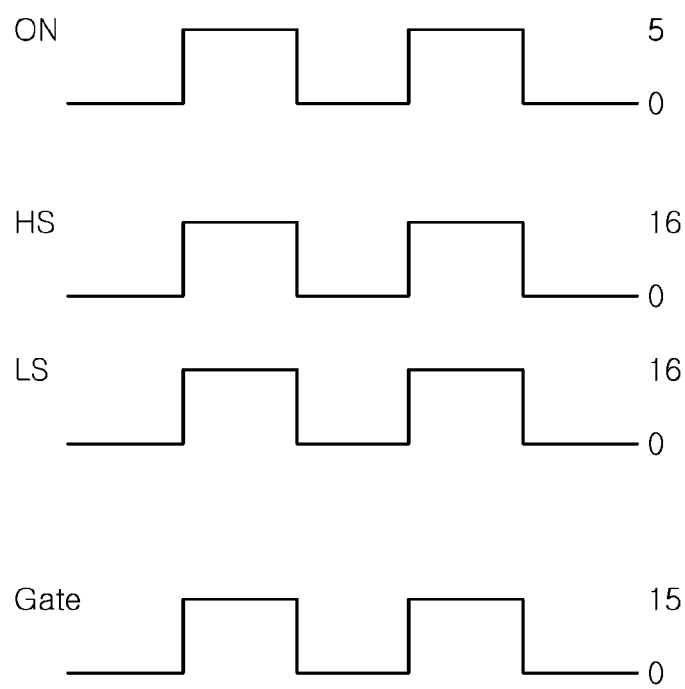
FIGS. 3 and 4 are graphs showing signal waveforms of main units of the gate driving circuit used in the power supply apparatus according to an exemplary embodiment of the present disclosure shown in FIG. 2.
Figure 4:
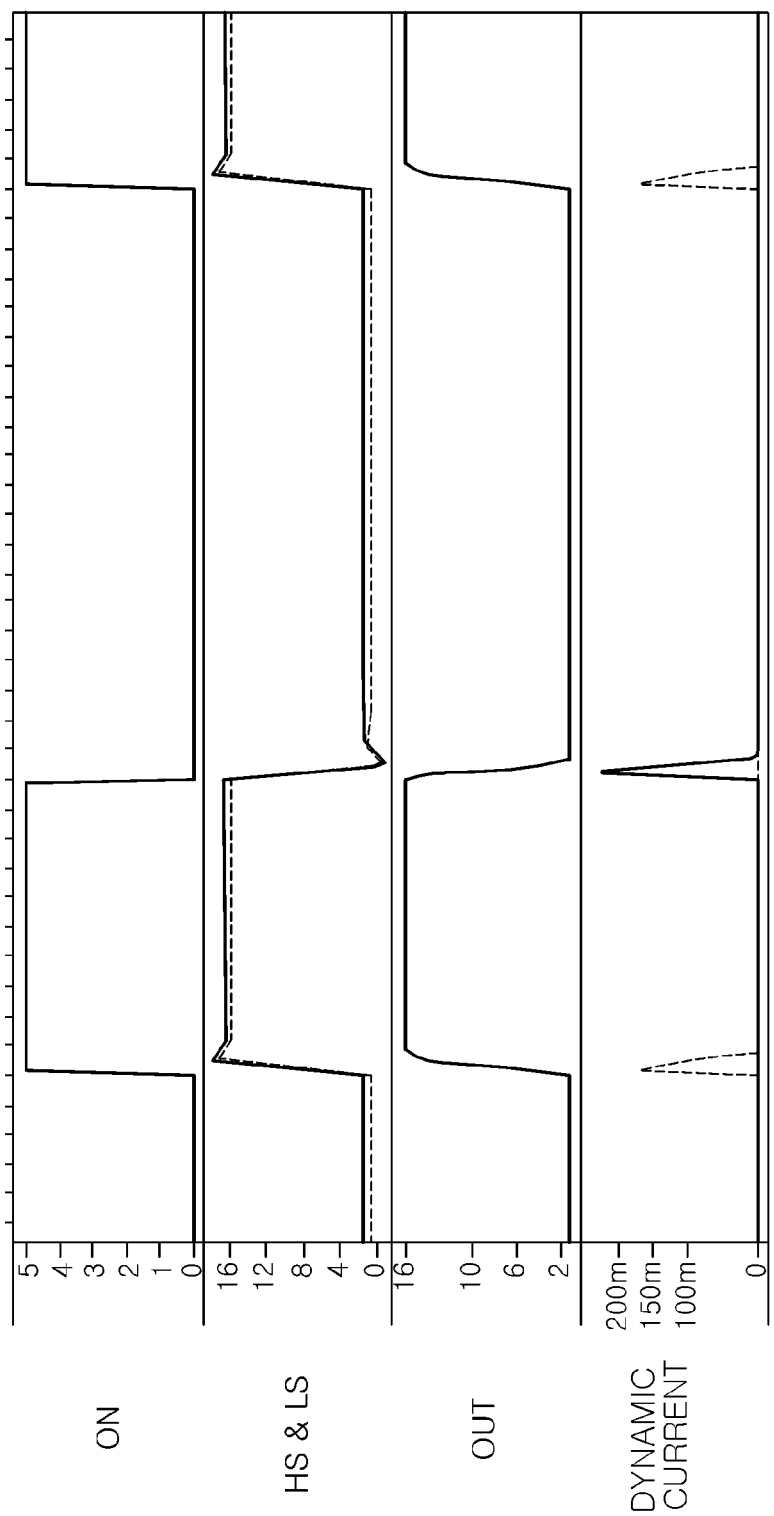

FIGS. 3 and 4 are graphs showing signal waveforms of main units of the gate driving circuit used in the power supply apparatus according to an exemplary embodiment of the present disclosure shown in FIG. 2.

As described above, the input signal ON may have the low level of 0V and the high level of 5V, the first N-MOSFET N1 of the bias unit 131*c* may be turned on depending on a high level signal of the input signal of which the voltage level is shifted by the level shifter 131*a*, and the first P-MOSFET P1 of the bias unit 131*c* may be turned on depending on a low signal of the input signal of which the voltage level is shifted by the level shifter 131*a*.

A bias power HS from the first N-MOSFET N1 and a bias power LS from the first P-MOSFET P1 may have, for example, a low level of 0V and a high level of 16V depending on a level of the input signal of which the voltage level is shifted, the second N-MOSFET N2 may be turned on/off depending on the high level and the low level of the bias power HS from the first N-MOSFET N1, and the second P-MOSFET P2 may be turned off/on depending on the high level and the low level of the bias power LS from the first P-MOSFET P1 to provide the gate signal GATE having, for example, a low level of 0V and a high level of 15V to the switch M.

The switch M and the gate driving circuit 131 described above may be implemented by a signal switching apparatus A, and the switch M may switch on/off an input power Vp depending on the gate signal GATE from the gate driving circuit 131.

Due to the configuration of the gate driving circuit 131 as described above, the case in which the second N-MOSFET N2 and the second P-MOSFET P2 are simultaneously turned on may not occur. Therefore, dead time controlling and a buffer for preventing the case in which the second N-MOSFET N2 and the second P-MOSFET P2 are simultaneously turned on may not be used, such that a dynamic current may be decreased.

The gate controlling unit 132 may provide the input signal to the gate driving circuit 131 based on the voltage level Vsup of the rectified power, a detection voltage CS at which the current flowing in the switch M is detected, and the state information ZCD based on the voltage level of the driving power VCC from the auxiliary winding.

As set forth above, according to exemplary embodiments of the present disclosure, a delay mismatch timing control through the dead time control may not be required, the gate driving circuit, and the switching apparatus and the power supply apparatus having the same may be implemented using a switching device having a low withstand voltage, a buffer may not be used, such that a flowing dynamic current is low, thereby decreasing power consumption, and manufacturing costs of the gate driving circuit, and the switching apparatus and the power supply apparatus having the same may be decreased.

While exemplary embodiments have been shown and described above, it will be apparent to those skilled in the art that modifications and variations could be made without departing from the spirit and scope of the present disclosure as defined by the appended claims.

What is claimed is:

1. A gate driving circuit comprising:
    a bias unit receiving an input signal having preset high and low signal levels, including a first N-channel metal oxide semiconductor field effect transistor (N-MOSFET) turned on when the input signal has the high level and a first P-channel MOS FET (P-MOSFET) turned on when the input signal has the low level, and supplying bias powers by the turning-on of the first N-MOSFET and the first P-MOSFET;

an amplifying unit including a second N-MOSFET turned on by receiving the bias power supplied from the first N-MOSFET when the input signal has the high level and a second P-MOSFET turned on by receiving the bias power supplied from the first P-MOSFET turned on when the input signal has the low level and providing a gate signal depending on the turning-on of the second N-MOSFET and the second P-MOSFET; and a constant current source unit including a plurality of constant current sources providing preset constant currents, wherein the first N-MOSFET and the first P-MOSFET are connected to each other in series between the plurality of constant current sources, a source of the first N-MOSFET and a source of the first P-MOSFET receive the input signal through resistors, respectively, and a gate of the first N-MOSFET and a gate of the first P-MOSFET supply the bias powers, respectively.

2. The gate driving circuit of claim 1, wherein the second N-MOSFET and the second P-MOSFET are connected to each other in series between a driving power terminal and a ground, a gate of the second N-MOSFET receives the bias power supplied from the first N-MOSFET, a gate of the second P-MOSFET receives the bias power supplied from the first P-MOSFET, and a source of the second N-MOSFET and a source of the second P-MOSFET are commonly connected to each other to output the gate signal.

3. The gate driving circuit of claim 1, further comprising a level shifter shifting the signal level of the input signal and transferring the input signal having the shifted signal level to the sources of the first N-MOSFET and the first P-MOSFET of the bias unit through the resistors, respectively.

4. The gate driving circuit of claim 2, further comprising an enabling switch connected to a gate signal output terminal of the amplifying unit and controlling whether or not the gate signal is output depending on an external control signal.

5. A switching apparatus comprising:
a gate driving circuit including a bias unit receiving an input signal having preset high and low signal levels, including a first N-MOSFET turned on in the case in which the input signal has the high level and a first P-MOSFET turned on in the case in which the input signal has the low level, and supplying bias powers by the turning-on of the first N-MOSFET and the first P-MOSFET, and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing a gate signal depending on the turning-on of the second N-MOSFET and the second P-MOSFET; and a switch switched on and off depending on the gate signal from the gate driving circuit to open and close a preset signal transfer path, wherein the gate driving circuit further includes a constant current source unit including a plurality of constant current sources providing preset constant currents, and wherein the first N-MOSFET and the first P-MOSFET are connected to each other in series between the plurality of constant current sources, a source of the first N-MOSFET and a source of the first P-MOSFET receive the input signal through resistors, respectively, and a gate of the first N-MOSFET and a gate of the first P-MOSFET supply the bias powers, respectively.

6. The switching apparatus of claim 5, wherein the second N-MOSFET and the second P-MOSFET are connected to each other in series between a driving power terminal and a ground, a gate of the second N-MOSFET receives the bias power supplied from the first N-MOSFET, a gate of the second P-MOSFET receives the bias power supplied from the first P-MOSFET, and a source of the second N-MOSFET and a source of the second P-MOSFET are commonly connected to each other to output the gate signal.

7. The switching apparatus of claim 5, wherein the gate driving circuit further includes a level shifter shifting the signal level of the input signal and transferring the input signal having the shifted signal level to the sources of the first N-MOSFET and the first P-MOSFET of the bias unit through the resistors, respectively.

8. The switching apparatus of claim 6, wherein the gate driving circuit further includes an enabling switch connected to a gate signal output terminal of the amplifying unit and controlling whether or not the gate signal is output depending on an external control signal.

9. A power supply apparatus comprising:
a power supplying unit switching an input power depending on a provided gate signal to supply a preset direct current (DC) power; and a controlling unit including a gate driving circuit including a bias unit receiving an input signal having preset high and low signal levels, including a first N-MOSFET turned on in the case in which the input signal has the high level and a first P-MOSFET tuned on in the case in which the input signal has the low level, and supplying bias powers by the turning-on of the first N-MOSFET and the first P-MOSFET, and an amplifying unit including a second N-MOSFET turned on by receiving the bias power supplied from the first N-MOSFET in the case in which the input signal has the high level and a second P-MOSFET turned on by receiving the bias power supplied from the first P-MOSFET turned on in the case in which the input signal has the low level and providing the gate signal controlling the switching of the power supplying unit depending on the turning-on of the second N-MOSFET and the second P-MOSFET, wherein the gate driving circuit further includes a constant current source unit including a plurality of constant current sources providing preset constant currents, and wherein the first N-MOSFET and the first P-MOSFET are connected to each other in series between the plurality of constant current sources, a source of the first N-MOSFET and a source of the first P-MOSFET receive the input signal through resistors, respectively, and a gate of the first N-MOSFET and a gate of the first P-MOSFET supply the bias powers, respectively.

10. The power supply apparatus of claim 9, wherein the power supplying unit includes:
a transformer having a primary winding receiving the input power, a secondary winding forming a preset turns ratio together with the primary winding and receiving a power induced from the primary winding, and an auxiliary winding forming a preset turns ratio together with the primary winding, receiving a power induced from the primary winding, and supplying a driving power to the controlling unit; and a switch switching on and off the input power from the primary winding depending on the gate signal from the controlling unit.

11. The power supply apparatus of claim 10, wherein the controlling unit further includes a gate controlling unit providing the input signal to the gate driving circuit based on a voltage level of the input power, a detection voltage at which a current flowing in the switch is detected, and a voltage level of the driving power from the auxiliary winding.

12. The power supply apparatus of claim 9, wherein the second N-MOSFET and the second P-MOSFET are connected to each other in series between a driving power terminal and a ground, a gate of the second N-MOSFET receives the bias power supplied from the first N-MOSFET, a gate of the second P-MOSFET receives the bias power supplied from the first P-MOSFET, and a source of the second N-MOSFET and a source of the second P-MOSFET are commonly connected to each other to output the gate signal.

13. The power supply apparatus of claim 9, wherein the gate driving circuit further includes a level shifter shifting the signal level of the input signal and transferring the input signal having the shifted signal level to the sources of the first N-MOSFET and the first P-MOSFET of the bias unit through the resistors, respectively.

14. The power supply apparatus of claim 9, wherein the gate driving circuit further includes an enabling switch connected to a gate signal output terminal of the amplifying unit and controlling whether or not the gate signal is output depending on an external control signal.

* * * * *